(12) United States Patent
Kurd et al.

(10) Patent No.: US 7,724,078 B2
(45) Date of Patent: May 25, 2010

(54) ADJUSTING PLL/ANALOG SUPPLY TO TRACK CPU CORE SUPPLY THROUGH A VOLTAGE REGULATOR

(75) Inventors: Nasser A. Kurd, Portland, OR (US); Chaodan Deng, Portland, OR (US); Thomas P. Thomas, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 157 days.

(21) Appl. No.: 11/726,788

(22) Filed: Mar. 22, 2007

(65) Prior Publication Data
US 2008/0231352 A1 Sep. 25, 2008

(51) Int. Cl.
*G05F 1/10* (2006.01)
(52) U.S. Cl. ........................ 327/544; 331/185; 331/186
(58) Field of Classification Search ................. 327/544; 331/34, 185, 186
See application file for complete search history.

(56) References Cited

U.S. PATENT DOCUMENTS

| | | | | |
|---|---|---|---|---|
| 5,463,352 A | * | 10/1995 | Chen | ........................... 331/1 R |
| 5,757,171 A | * | 5/1998 | Babcock | ..................... 323/271 |
| 5,963,058 A | | 10/1999 | Thomas | |
| 6,043,717 A | | 3/2000 | Kurd | |
| 6,125,217 A | | 9/2000 | Paniccia et al. | |
| 6,140,883 A | | 10/2000 | Thomas | |
| 6,266,779 B1 | | 7/2001 | Kurd | |
| 6,320,424 B1 | | 11/2001 | Kurd et al. | |
| 6,441,660 B1 | * | 8/2002 | Ingino, Jr. | .................... 327/156 |
| 6,469,550 B1 | | 10/2002 | Kurd | |
| 6,477,657 B1 | | 11/2002 | Kurd et al. | |
| 6,489,821 B1 | | 12/2002 | Kurd et al. | |
| 6,538,497 B2 | | 3/2003 | Thomas et al. | |
| 6,621,313 B2 | | 9/2003 | Kurd et al. | |
| 6,622,255 B1 | | 9/2003 | Kurd et al. | |
| 6,650,133 B1 | | 11/2003 | Deng | |
| 6,650,161 B2 | | 11/2003 | Thomas et al. | |
| 6,664,775 B1 | * | 12/2003 | Clark et al. | .................. 323/351 |
| 6,670,833 B2 | | 12/2003 | Kurd et al. | |
| 6,697,952 B1 | * | 2/2004 | King | .......................... 713/300 |
| 6,704,892 B1 | | 3/2004 | Kurd et al. | |
| 6,741,102 B1 | | 5/2004 | Thomas | |
| 6,760,801 B1 | | 7/2004 | Thomas et al. | |
| 6,882,238 B2 | | 4/2005 | Kurd et al. | |
| 6,922,111 B2 | | 7/2005 | Kurd et al. | |
| 6,922,112 B2 | | 7/2005 | Kurd et al. | |
| 7,015,741 B2 | | 3/2006 | Tschanz et al. | |
| 7,042,259 B2 | | 5/2006 | Kurd et al. | |
| 7,102,402 B2 | | 9/2006 | Kurd et al. | |
| 7,133,751 B2 | | 11/2006 | Kurd et al. | |
| 7,282,966 B2 | | 10/2007 | Narendra et al. | |
| 7,342,426 B2 | | 3/2008 | Kurd et al. | |
| 2005/0083762 A1 | * | 4/2005 | Ikai et al. | ..................... 365/226 |

(Continued)

*Primary Examiner*—Joseph Chang
*Assistant Examiner*—Jeffrey Shin
(74) *Attorney, Agent, or Firm*—Erik R. Nordstrom

(57) ABSTRACT

A processing device includes a Phase Locked Loop (PLL) system with an adjustable power supply designed to track the power supply provided to one or more of the cores in the processor device. The PLL no longer operates at a fixed voltage level that is held constant and independent from the requested core frequency or the core digital voltage, but rather the power supply to the phase locked loop is adjusted along with the main power supply to the processor core.

22 Claims, 4 Drawing Sheets

U.S. PATENT DOCUMENTS

| | | |
|---|---|---|
| 2007/0096841 A1* | 5/2007 | Connell et al. .............. 331/183 |
| 2007/0156370 A1* | 7/2007 | White et al. ................ 702/132 |
| 2007/0238434 A1 | 10/2007 | Kurd et al. |
| 2008/0101523 A1 | 5/2008 | Kurd et al. |
| 2008/0122550 A1 | 5/2008 | Kurd et al. |
| 2008/0136396 A1* | 6/2008 | Heilmann ................... 323/298 |

* cited by examiner

ADJUSTING PLL/ANALOG SUPPLY TO TRACK CPU CORE SUPPLY THROUGH A VOLTAGE REGULATOR

To achieve lower power consumption, a power supply to a processor's execution core sections may be adjusted based on a desired clock frequency. A Phase Lock Loop (PLL) generates the clock signals and sets the desired operating frequency for the clock signals supplied to the core. The PLL operates at a fixed voltage level that is held constant and independent from the requested core frequency or the core digital voltage. As selections in voltage and frequency combinations are made to satisfy core power consumption requirements, the PLL operating voltage has remained fixed.

The PLL's clock distribution bandwidth is limited by the digital supply, and therefore, during PLL startup and lock acquisition additional margin has been added into the clock distribution bandwidth to accommodate an initial higher frequency from the PLL. This over design comes at a power cost, and accordingly, improved low power PLL circuits and methods for generating the core clock frequencies are needed.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
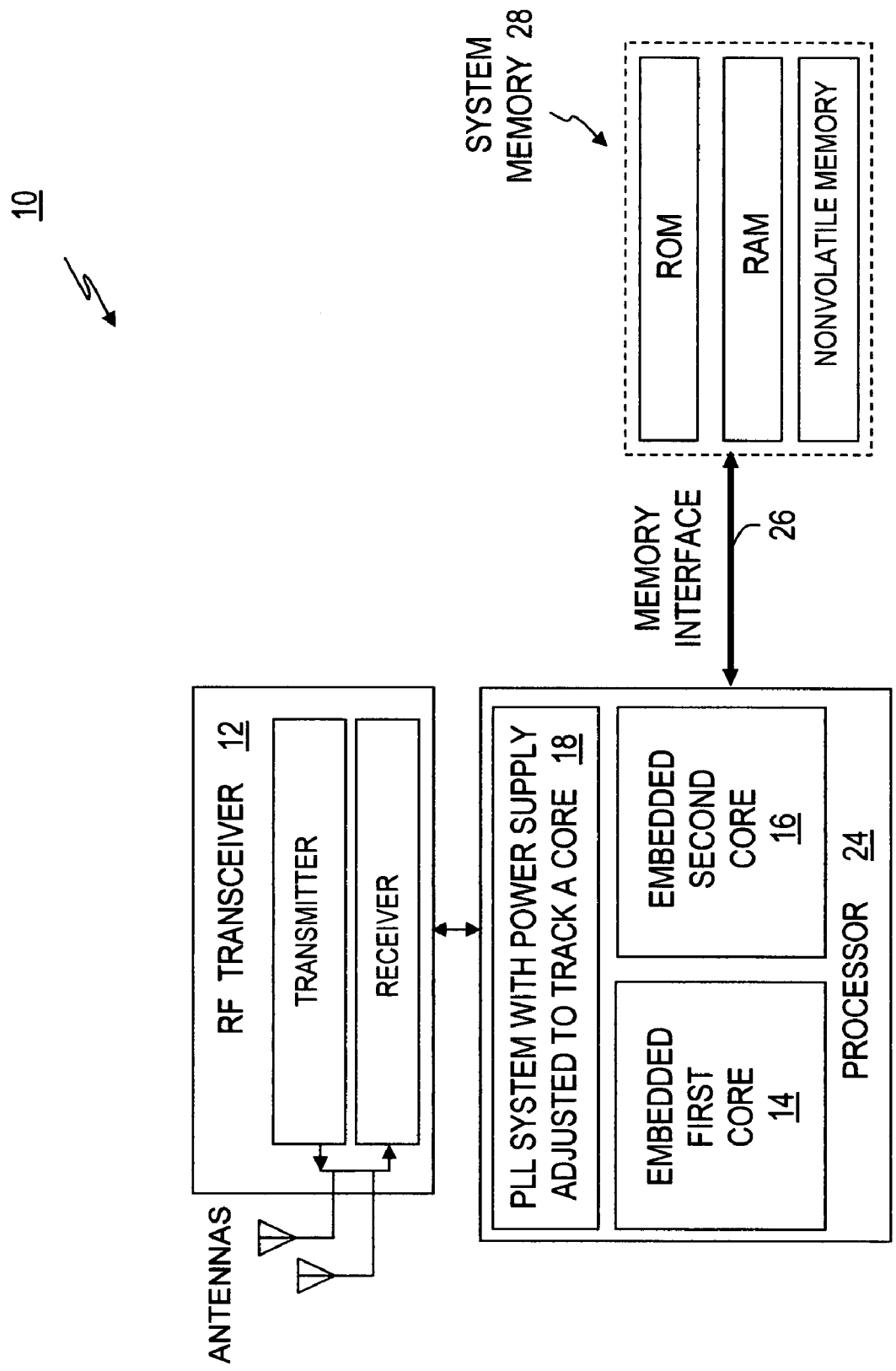
FIG. 1 is a diagram that illustrates a wireless device that implements a PLL with a power supply adjusted to track a processor core in accordance with the present invention.

It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

The embodiment illustrated in FIG. 1 shows a wireless communications device 10 that may include one or more radios to allow communication with other over-the-air communication devices. Although the embodiment illustrates the coupling of antenna(s) to a transceiver 12 to accommodate modulation and demodulation, it should be noted that the present invention is not limited to wireless applications and may be used in a variety of products. For instance, the claimed subject matter may be incorporated into desktop computers, laptops, smart phones, MP3 players, cameras, communicators and Personal Digital Assistants (PDAs), medical or biotech equipment, automotive safety and protective equipment, automotive infotainment products, etc. However, it should be understood that the scope of the present invention is not limited to these examples.

In general, the illustrated wireless embodiment shows an analog front end transceiver 12 that may be a stand-alone Radio Frequency (RF) discrete device or embedded with a processor 24 as a mixed-mode integrated circuit. Processor 24 may include baseband and applications processing functions and utilize one or more processor cores 20 and 22 to handle application functions and allow processing workloads to be shared across the cores. The processor may transfer data through an interface 26 to memory storage in a system memory 28.

FIG. 1 further illustrates a Phase Locked Loop (PLL) system 18 located in processor 24 that includes an adjustable power supply Vccpll designed to track the power supply Vcc provided to one or more of the cores in accordance with the present invention. Whereas prior art PLLs operate at a fixed voltage level that is held constant and independent from the requested core frequency or the core digital voltage, the power supply to the phase locked loop in PLL system 18 is adjusted along with the main power supply to the processor core to satisfy overall power constraints. By adjusting the phase locked loop power supply Vccpll to track the CPU core power supply Vcc, an additional power savings is achieved and performance of the PLL is improved. PLL system 18 no longer requires over design of the Voltage Controlled Oscillator (VCO) gain that may worsen PLL performance and make it more susceptible to input, feedback and supply noises.

Figure 2:
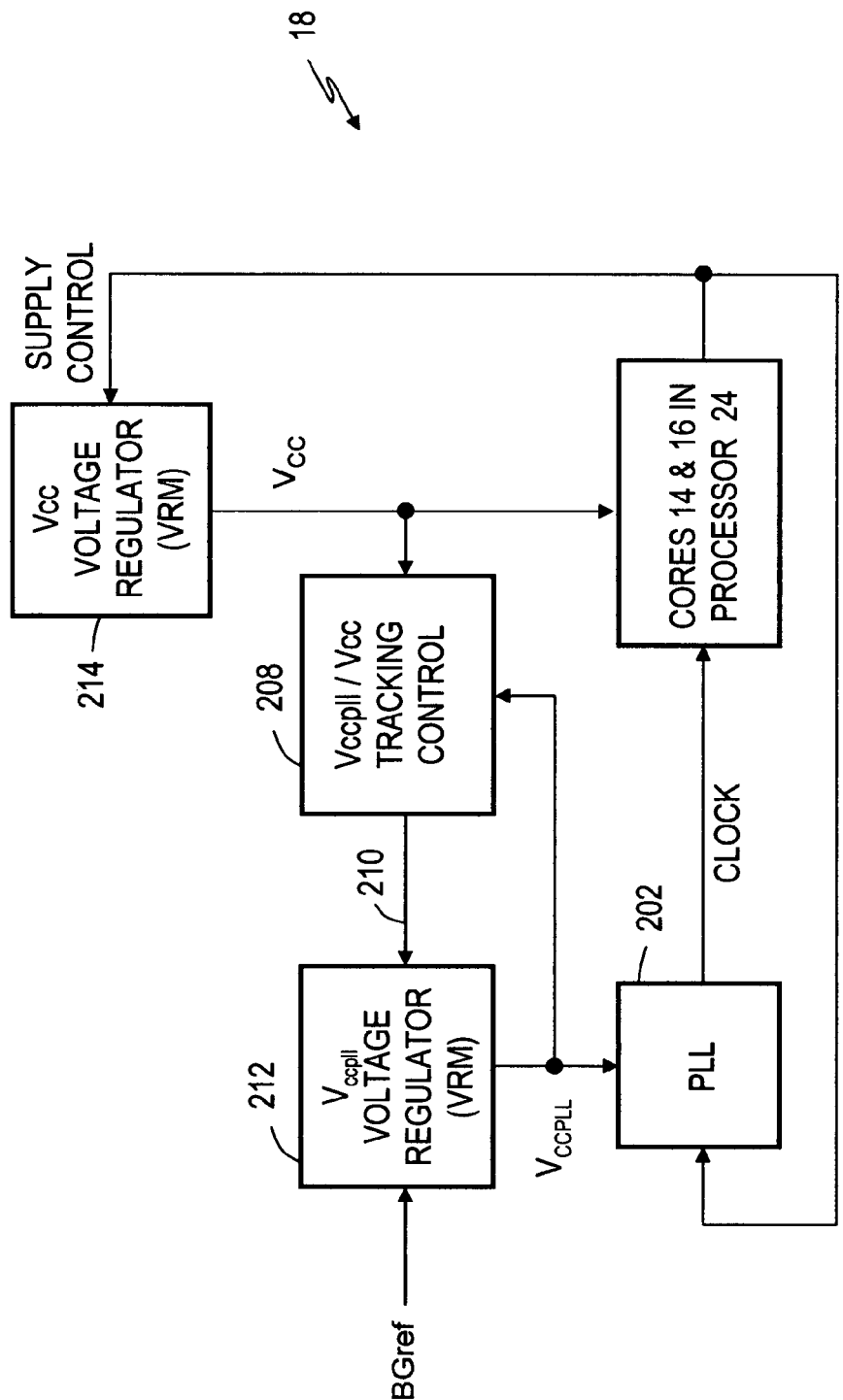
FIG. 2 illustrates an embodiment for the Phase Locked Loop (PLL) system shown in FIG. 1.

FIG. 2 illustrates an embodiment for the Phase Locked Loop (PLL) system 18 shown in FIG. 1. A phase locked loop circuit 202 generates and outputs a clock signal in relation to the frequency and phase of an input reference signal. The phase-locked loop circuit responds to both the frequency and the phase of the input signals, automatically raising or lowering the frequency of a controlled oscillator (VCO) until it is matched to the reference signal in both frequency and phase. The clock signal generated in the phase locked loop circuit 202 may be supplied to one of the cores 14 or 16 in processor 24.

The figure also shows that Vccpll voltage regulator (VRM) 212 is designed to automatically maintain a desired voltage level Vccpll that supplies phase lock loop 202. Whereas prior art VRMs operate by comparing an actual output voltage to a precise bandgap reference voltage, in contrast the present invention delivers the desired voltage level Vccpll to phase locked loop circuit 202 without the need of a precise bandgap reference level or bandgap trimming. By not requiring the precise bandgap reference voltage, the present invention allows a significant reduction in test time to verify the various voltage/frequency combinations that may be used by the cores in the processor, particularly for a multi-core product where multiple PLLs, bandgap references and VRMs are used.

In present processors, the CPU core power supply Vcc may be adjusted dynamically based on the clocking frequency needed to perform the functionality currently being executed by the core. The figure shows that Vcc voltage regulator (VRM) 214 generates and maintains the desired voltage level Vcc supplied to the core. But in accordance with the present invention, Vcpll/Vcc tracking control block 208 receives both the voltage Vcc supplied to the core and the current voltage Vccpll being supplied to phase locked loop circuit 202, then provides an adjustment signal 210 to Vccpll voltage regulator (VRM) 212. Adjustment signal 210 is used by Vccpll voltage regulator (VRM) 212 to ensure that the voltage Vccpll is approximately the same as the voltage Vcc. In other words, the voltage Vccpll generated by Vccpll voltage regulator (VRM) 212 is made to track the voltage Vcc that is currently being supplied to a selected core.

The clock frequency control illustrated in FIG. 2 provides a mechanism to reduce power and improve performance of the clock generation and distribution system for a processor core, but it should be pointed out that multiple PLLs may be used in multi-core systems that incorporate the features of the present invention. The multiple PLLs in the multi-core systems are enabled or disabled as the cores cycle through power management states. The embodiments of the present invention allow phase locked loop circuit 202 to operate at lower power levels by adjusting the power supply Vccpll to dynamically match the CPU core power supply, which avoids over design in the clock distribution bandwidth. By eliminating over design in the clock distribution bandwidth to sustain the potential higher initial frequency during initial lock, the present PLL illustrated in the figure improves performance.

Figure 3:
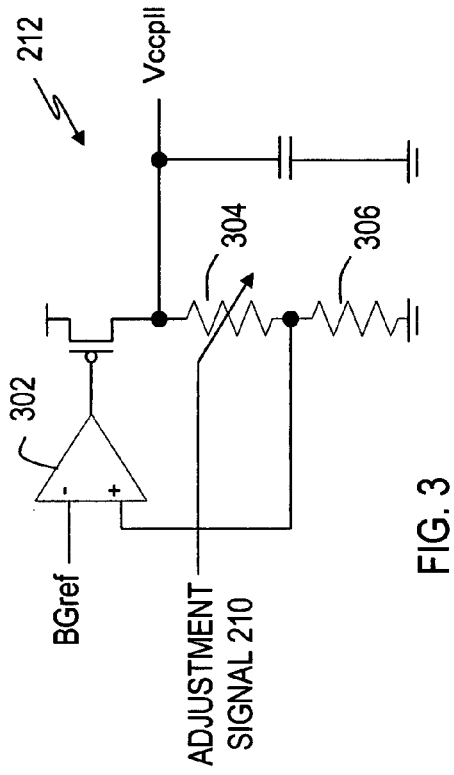
FIG. 3 is an embodiment of a Vccpll voltage regulator (VRM) that may be used to adjust the voltage Vccpll supplied to the phase locked loop circuit.

FIG. 3 illustrates a simplistic view of an embodiment for Vccpll voltage regulator (VRM) 212 that may be used to control and adjust the voltage Vccpll supplied to phase locked loop circuit 202. As shown in the figure, a bandgap reference level BGref (non-critical value) is provided at one input of a comparator 302, while the other input is provided from a resistor divider of resistors 304 and 306. Resistor 304 is a variable resistor whose resistance is varied using adjustment signal 210 as generated by Vccpll/Vcc tracking control block 208. The output voltage Vccpll generated by Vccpll voltage regulator (VRM) 212 is proportional to the non-critical bandgap reference level BGref.

Vccpll/Vcc tracking control block 208 compares the supply voltage Vccpll generated by Vccpll voltage regulator (VRM) 212 against the digital supply voltage Vcc and increments or decrements the VR voltage control/trim bits to digitally track Vcc. Once the supply voltage Vccpll is adjusted to be within a predetermined voltage band or voltage range that is close to Vcc, no further changes are made to the VR control bits (steady state) until there is a change in Vcc itself. Since analog circuits in phase locked loop circuit 202 generally require and tolerate equal or a higher voltage than the digital circuits in the core supplied by Vcc, this voltage band may be set to a voltage value that is slightly higher than Vcc.

By allowing the Vccpll voltage generated for phase locked loop circuit 202 to track the digital supply and frequency of the core, it is easier to optimize the phase locked loop circuit 202 and the clock distribution circuits (frequency and voltage headroom and VCO gain, Kvco). The jitter of phase locked loop circuit 202 at higher frequencies may be reduced and the power may be reduced. Also, when the Vccpll voltage is allowed to vary with the core digital supply Vcc, signals that cross voltage domains are easier to handle. Not requiring a very accurate band gap reference, as required in the case of a fixed PLL operating voltage, saves test time (calibration, trimming) and cost.

Figure 4:
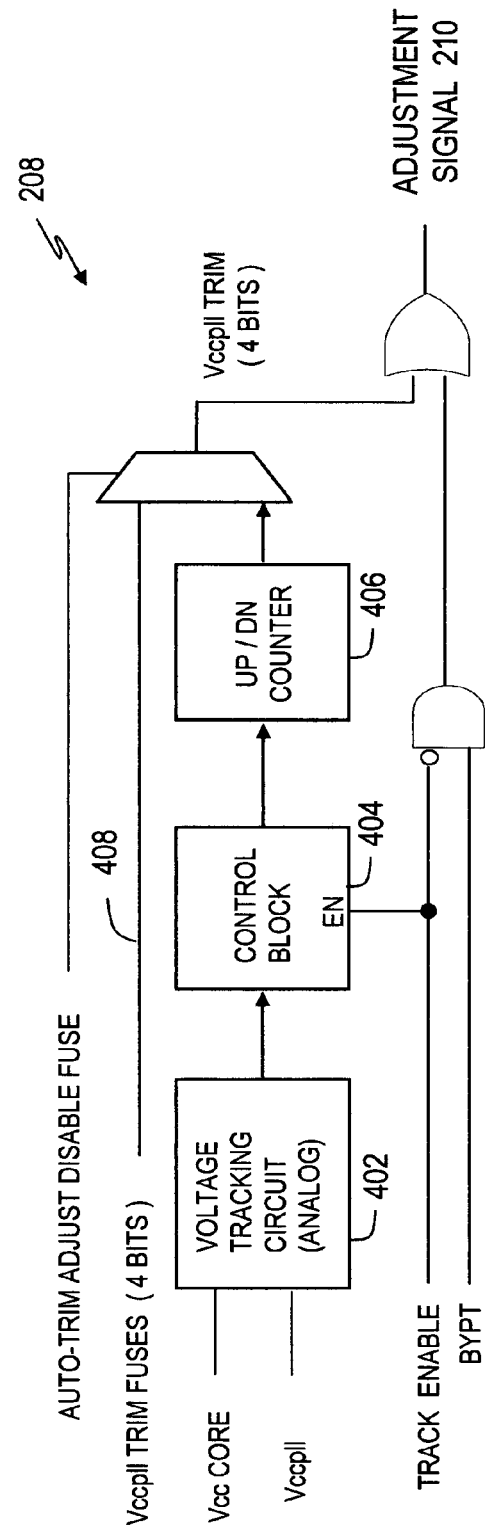
FIG. 4 is a block diagram that describes the Vccpll/Vcc tracking control block.

FIG. 4 is a block diagram that further describes Vccpll/Vcc tracking control block 208 (see FIG. 2). In the diagram, a voltage tracking circuit 402 receives the voltage Vcc and the voltage Vccpll, comparing the voltage Vcc with the voltage Vccpll. A control block 404 receives an enable signal TRACK ENABLE, and if enabled and if the voltage Vcc is greater than the voltage Vccpll as determined in voltage tracking circuit 402, then an up/dn counter 406 is incremented. On the other hand, if the voltage Vcc is less than the voltage Vccpll, then up/dn counter 406 is decremented.

The adjustment signal 210 provides output bits from up/dn counter 406 that drive the VRM trim bits in Vccpll voltage regulator (VRM) 212. In order to reach a steady state constant for the value of voltage Vccpll, Vccpll voltage regulator (VRM) 212 provides another comparison with a positive offset. No further action is taken if the resulting Vccpll value is between Vcc and (Vcc+offset). An RC filter may be added at the front end of the comparator sensing to reject any high frequency noise on the digital supply.

Figure 5:
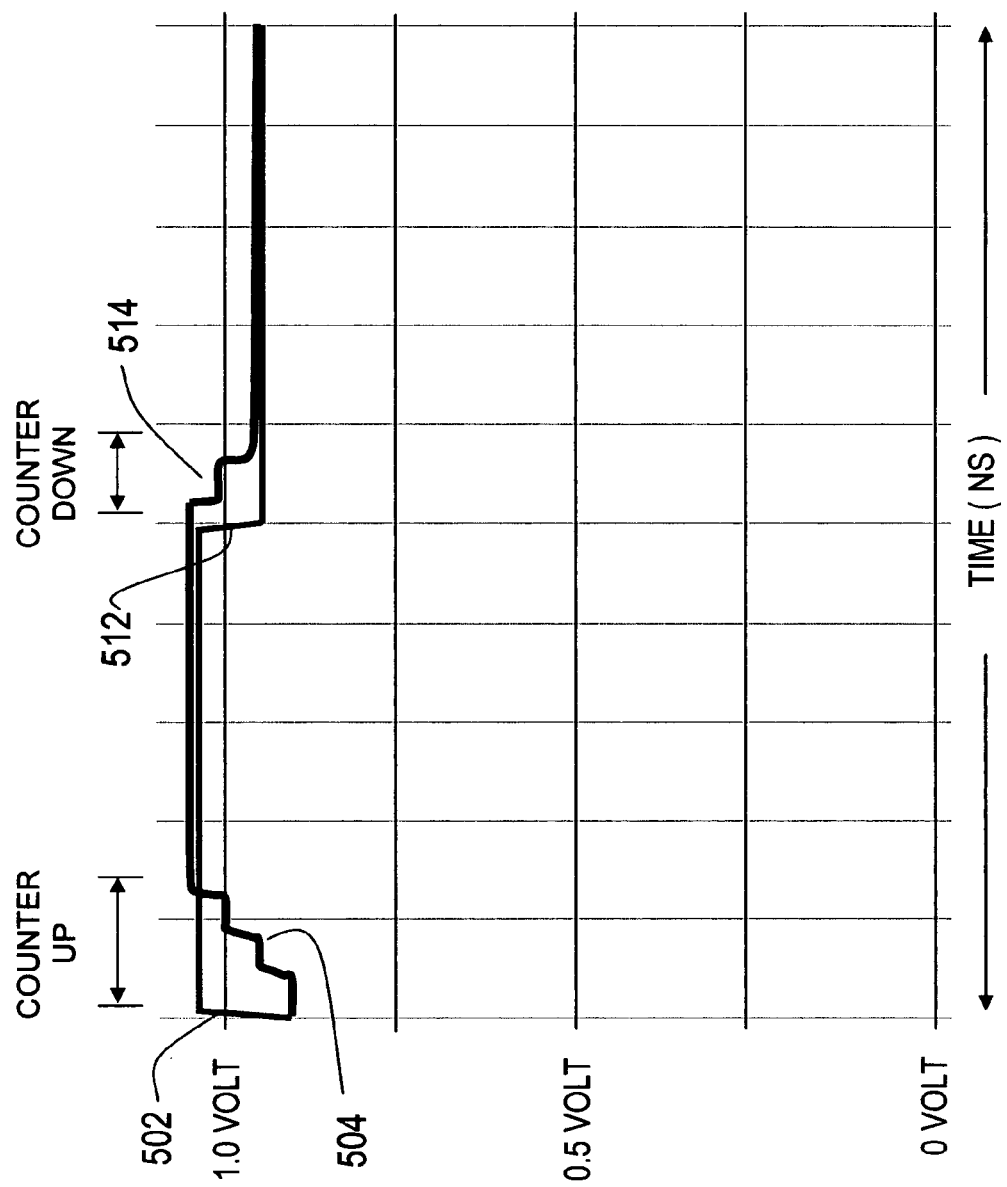
FIG. 5 is a simulation to show the operation of tracking the operating voltage of a core and adjusting the power supply to the Phase Locked Loop (PLL) system to substantially match the operating voltage of the core.

FIG. 5 shows simulation results for Phase Locked Loop (PLL) system 18 (see FIGS. 1 and 2). In the figure, trace 502 is the voltage Vcc provided to a processor core. Trace 504 is the voltage Vccpll that is generated by Vccpll voltage regulator (VRM) 212 to operate phase locked loop circuit 202. At PLL start-up, the voltage Vcc provided to the processor core is raised as indicated by trace 502. Vccpll/Vcc tracking control block 208 operates by voltage tracking circuit 402 comparing the voltage Vcc with the voltage Vccpll, determining that the voltage Vcc is greater than the voltage Vccpll and incrementing the up/dn counter 406. Through successive steps of comparing the voltage Vcc with the voltage Vccpll and incrementing the up/dn counter 406, the voltage Vccpll is successively raised as indicated by trace 504.

Thus, Vccpll/Vcc tracking control block 208 changes the adjustment signal 210 used by Vccpll voltage regulator (VRM) 212 to ensure that the voltage Vccpll is approximately the same as the voltage Vcc. As shown in the simulation provided for Phase Locked Loop (PLL) system 18, the voltage Vccpll generated by Vccpll voltage regulator (VRM) 212 is made to track the voltage Vcc that is currently being supplied to the selected core. When the voltage Vccpll is raised to the (Vcc+offset) level, further action and adjustments to Vccpll are not needed.

Trace 512 indicates that the voltage Vcc supplied to operate the core has been lowered. In this case, voltage tracking circuit 402 compares the voltage Vcc with the voltage Vccpll, determines that the voltage Vcc is less than the voltage Vccpll and decrements the up/dn counter 406. Through successive steps of comparing the voltage Vcc with the voltage Vccpll and decrementing the up/dn counter 406, the voltage Vccpll supplied to phase locked loop circuit 202 is successively lowered as indicated by trace 514.

By now it should be apparent that embodiments of the present invention allow a PLL to adapt to a core supply voltage that is dynamically adjusted to meet power budget constraints. With the presented embodiments, the voltage regulator delivers a PLL power supply without the need of a precisely controlled bandgap reference level since it affectively works as an auto-calibration mechanism. This described process reduces test costs associated with calibration and also reduces design time required in delivering precise voltage references. The voltage to operate the PLL now tracks the supply that operates the core, which allows the PLL to operate with a reduced VCO gain that eliminates over design of the PLL range. Thus, the PLL voltage tracks the digital supply to eliminate over design in the clock distribution bandwidth by holding the maximum frequency from PLL proportional to core requirement as set by digital supply.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

The invention claimed is:

1. A processing device, comprising:
   a core in the processing device to operate at a core voltage;
   a phase lock loop to generate and output a clock signal in relation to a frequency and phase of an input reference signal; and
   a tracking circuit to compare the core voltage with a separate, independently controllable voltage supplied to operate the phase lock loop and output a signal to adjust the voltage supplied to operate the phase lock loop to track the core voltage.

2. The processing device of claim 1 further including a voltage regulator to receive the output signal from the tracking circuit and generate the voltage supplied to operate the phase lock loop that is proportional to a bandgap reference level.

3. The processing device of claim 2 wherein the voltage regulator includes a comparator having the bandgap reference level at one input and a voltage at another input determined through a resistor divider.

4. The processing device of claim 1 wherein the tracking circuit includes an analog comparator to determine which of the core voltage or the voltage supplied to operate the phase lock loop is greater.

5. The processing device of claim 4 wherein the tracking circuit includes a counter coupled to the analog comparator to provide an up count when the core voltage is greater than the voltage supplied to operate the phase lock loop.

6. The processing device of claim 4 wherein the tracking circuit includes a counter coupled to the analog comparator to provide a down count when the voltage supplied to operate the phase lock loop is greater than the core voltage.

7. The processing device of claim 2 wherein the voltage regulator receives a positive or negative offset to compare with a reference voltage.

8. A device having a processor core, comprising:
   a phase lock loop to generate a clock signal for the processor core;
   a tracking circuit to monitor a voltage to operate the phase lock loop and a core supply voltage, separate and independently controllable of the core supply, to operate the processor core; and
   a voltage regulator that receives an adjustment signal from the tracking circuit to adjust the voltage to operate the phase lock loop to track the voltage supplied to operate the processor core.

9. The device of claim 8 wherein the voltage to operate the phase lock loop is adapted to the core supply voltage that is dynamically changed to meet power budget constraints.

10. The device of claim 8 wherein the tracking circuit includes an analog comparator coupled to a counter to increment the counter when the core supply voltage is greater than the voltage to operate the phase lock loop.

11. The device of claim 8 wherein the tracking circuit includes an analog comparator coupled to a counter to decrement the counter when the core supply voltage is less than the voltage to operate the phase lock loop.

12. A processing device having multi-cores, comprising:
    a Phase Locked Loop (PLL) operating with an adjustable power supply; and
    a tracking circuit to monitor a core power supply, separate from the adjustable power supply, provided to one of the multi-cores and using successive steps to change the adjustable power supply to substantially track the core power supply.

13. The processing device of claim 12 wherein the tracking circuit includes a comparator to determine whether the core power supply is greater than the adjustable power supply.

14. The processing device of claim 13 wherein the tracking circuit includes a counter that is incremented when the core power supply is greater than the adjustable power supply.

15. The processing device of claim 14 wherein the counter that is incremented raises the adjustable power supply to substantially match the core power supply.

16. The processing device of claim 13 wherein the tracking circuit includes a counter that is decremented when the core power supply is less than the adjustable power supply.

17. A processing device having multi-cores, comprising:
    a voltage regulator for a Phase Locked Loop (PLL); and
    a tracking circuit to compare a core power supply and an adjustable power supply generated by the voltage regulator, the core supply being independently controllable from the adjustable supply, wherein the tracking circuit increments or decrements voltage control bits to the voltage regulator to adjust the adjustable power supply to the core power supply.

18. The processing device of claim 17 wherein the adjustable power supply to the PLL is adjusted to within a predetermined voltage band.

19. The processing device of claim 18 wherein changes are not made to the control bits in a steady state condition until there is a change in the core power supply.

20. The processing device of claim 18 wherein the predetermined voltage band is set to be slightly higher than the core power supply.

21. A method of changing an operating voltage to a Phase Locked Loop (PLL) comprising:
    tracking a core power supply provided to a core of a processor; and
    using a counter to provide successive steps to change the operating voltage to the PLL, the operating PLL voltage being independently controllable from the core supply.

22. The method of claim 21 further including: incrementing the counter to raise the operating voltage to the PLL and decrementing the counter to lower the operating voltage to the PLL to provide the successive steps to change the operating voltage to the PLL to substantially match the core power supply.

* * * * *